(12) United States Patent
Eder

(10) Patent No.: US 9,386,710 B2
(45) Date of Patent: Jul. 5, 2016

(54) METHOD FOR PRODUCING CIRCUIT BOARDS AND COMPLETE CIRCUIT BOARD PANELS

(75) Inventor: Marcus Eder, Vienna (AT)

(73) Assignee: OTTO BOCK HEALTHCARE PRODUCTS GMBH, Vienna (AT)

(*) Notice: Subject to any disclaimer, the term of this patent is extended or adjusted under 35 U.S.C. 154(b) by 58 days.

(21) Appl. No.: 14/124,652

(22) PCT Filed: Jun. 7, 2012

(86) PCT No.: PCT/EP2012/002426
§ 371 (c)(1),
(2), (4) Date: Dec. 6, 2013

(87) PCT Pub. No.: WO2012/167937
PCT Pub. Date: Dec. 13, 2012

(65) Prior Publication Data
US 2014/0118981 A1    May 1, 2014

(30) Foreign Application Priority Data
Jun. 9, 2011    (DE) .......................... 10 2011 106 104

(51) Int. Cl.
*H05K 1/03* (2006.01)
*H05K 3/46* (2006.01)
(Continued)

(52) U.S. Cl.
CPC .. *H05K 3/46* (2013.01); *H05K 1/14* (2013.01); *H05K 3/0052* (2013.01); *H05K 3/0097* (2013.01); *H05K 1/0298* (2013.01); *H05K 3/0032* (2013.01); *Y10T 29/49155* (2015.01)

(58) Field of Classification Search
CPC ..... H05K 1/0306; H05K 3/40; H05K 3/0097; H05K 3/4092; H01L 21/02; H01L 21/48; H01L 23/12; H01L 23/13; H01L 23/48; H01L 23/70; H01L 23/495; H01L 23/498

USPC .......................... 174/255, 267; 428/209, 210; 257/E23.004, E23.036, 666
See application file for complete search history.

(56) References Cited

U.S. PATENT DOCUMENTS 5,053,921 A    10/1991 Nelson et al.
5,274,197 A *  12/1993 Kondo .............. H01L 23/49531
                                                    174/267
(Continued)

FOREIGN PATENT DOCUMENTS

CN    1677667 A    10/2005
CN    101351883 A    1/2009
(Continued)

OTHER PUBLICATIONS

PCT International Search Report for PCT International Patent Application No. PCT/EP2012/002426, mailed Dec. 19, 2012.
(Continued)

*Primary Examiner* — Xiaoliang Chen
(74) *Attorney, Agent, or Firm* — Holland & Hart

(57) ABSTRACT

The invention relates to a method for producing populated or unpopulated circuit boards or individual circuits as individual panels (2) from a complete panel (1) having a circuit board base material (4), wherein the particular individual panel (2) is removed from the complete panel (1) using a laser, wherein the individual panel is fastened to the complete panel (1) by means of metal connections (3) before the individual panel (2) is removed, the circuit board base material (4) is removed except for the metal connections (3), and the individual panels (2) are separated from, in particular pressed out of, the complete panel (1) after the circuit board base material (4) has been removed.

13 Claims, 3 Drawing Sheets

(51) Int. Cl.
*H05K 3/00* (2006.01)
*H05K 1/14* (2006.01)
*H05K 1/02* (2006.01)

(56) References Cited

U.S. PATENT DOCUMENTS

| | | | |
|---|---|---|---|
| 5,508,089 A * | 4/1996 | Schulz-Harder | H01L 21/4807 257/E23.004 |
| 5,640,763 A * | 6/1997 | Lindberg | H05K 3/0052 29/426.1 |
| 5,676,855 A * | 10/1997 | Schulz-Harder | H01L 21/4807 216/13 |
| 5,721,044 A * | 2/1998 | Schmidt | H01L 23/13 257/E23.004 |
| 6,207,221 B1 | 3/2001 | Schulz-Harder | |
| 7,488,620 B2 | 2/2009 | Takiar et al. | |
| 8,338,234 B2 | 12/2012 | Iimura et al. | |
| 8,409,886 B2 * | 4/2013 | Iwafuchi | H01L 21/2007 257/88 |
| 2005/0212113 A1 | 9/2005 | Iimura | H01L 21/481 257/690 |
| 2007/0087644 A1 * | 4/2007 | Iwafuchi | H01L 21/2007 445/1 |
| 2007/0155046 A1 * | 7/2007 | Takiar | G06K 19/07732 438/106 |
| 2009/0026168 A1 | 1/2009 | Tsai et al. | |
| 2009/0223046 A1 * | 9/2009 | Murayama | H01L 21/4857 29/847 |
| 2009/0278252 A1 * | 11/2009 | Oikawa | H01L 23/293 257/702 |
| 2012/0140423 A1 * | 6/2012 | Fisher, Jr. | H05K 3/284 361/748 |
| 2013/0213853 A1 * | 8/2013 | Brautigam | H01L 21/67353 206/706 |

FOREIGN PATENT DOCUMENTS

| | | |
|---|---|---|
| DE | 4134172 A1 | 4/1992 |
| DE | 4319944 A1 | 12/1994 |
| DE | 10027732 A1 | 12/2001 |
| EP | 2180771 A1 | 4/2010 |
| GB | 775267 | 5/1957 |
| JP | 02084282 A | 3/1990 |
| JP | 10-335762 | 12/1998 |

OTHER PUBLICATIONS

First Office Action for JP Patent Application No. 2014-513945, English Translation, mailed Jan. 26, 2016 (5 pp.).

Search Report for Chinese Patent Application No. 201280028231.2, English Translation, mailed Apr. 11, 2016 (2 pp.).

* cited by examiner under certain circumstances making it easier to produce the complete panel. A number of individual panels can thereby be connected to one another by the metal connection.

METHOD FOR PRODUCING CIRCUIT BOARDS AND COMPLETE CIRCUIT BOARD PANELS

TECHNICAL FIELD

The invention relates to a method for producing populated or unpopulated circuit boards or individual circuits as individual panels from a complete panel having a circuit-board base material, wherein the respective individual panel is removed from the complete panel with a laser. The invention likewise relates to a complete circuit board panel having a multiplicity of individual panels of populated or unpopulated circuit boards or individual circuits.

BACKGROUND

US 2009/0026168 A2 describes a method for producing rigid-flexible circuit boards having a flexible circuit board with an interposed base layer, which is arranged between two layers with electrical circuits. The two layers are laminated with the copper circuits by a protective layer, onto which in turn a dielectric layer is laminated, onto which in turn a copper foil is laminated. A rigid circuit board structure is formed between two rigid parts, which are flexibly connected to one another by the dielectric layer having predetermined openings. In a first cutting process, the dielectric material is removed at an interface between a lying region and the rigid part by formation of a first groove, while exposing part of the copper foil. In a second cutting process, a second groove is cut in, laterally offset from the first groove, and the opposite copper layer is exposed. This is followed by an etching process, in order to remove the exposed copper foil at the bottom of the first groove, thereby creating a second groove, which is in connection with the previously formed opening. The rigid structure that still remains is removed in the bending region.

This method is very laborious and, apart from the cutting out of partial layers by means of a laser beam, envisages the use of etching chemicals and possibly mechanical cutting tools.

SUMMARY

The object of the present invention is to produce a method and a circuit board panel with which an exact-contour, splinter-free separation of individual panels from a complete circuit board panel is made possible.

This object is achieved according to the invention by a method with the features of the main claim and a complete circuit board panel with the features of the alternative independent claim. Advantageous configurations and developments of the invention are disclosed in the subclaims, the description and the figures.

The method produces populated or unpopulated circuit boards or individual circuits as individual panels from a complete panel having a circuit-board base material, wherein the respective individual panel is removed from the complete panel. Before removal of the individual panel from the complete panel, the individual panel is fastened to the complete panel by way of metal connections. The metal connections remain fixed to the individual panel as the circuit-board base material is removed from the complete panel. Following the removal of the circuit-board base material, the individual panel is separated from the complete panel by pressing out the individual panel with respect to the complete panel and thus disconnecting the individual panel from the metal connections).

The metal connections that protrude beyond the periphery of the individual panel fix the individual panel to the complete panel when the circuit-board base material has been removed from all around the periphery. The metal connections thereby preferably protrude from the complete panel into the contour of the individual panel, the metal connections or the metal connection not having the effect of completely covering the individual panel. The individual panel is consequently not underpinned completely by the metal connection, but only in a region that adjoins the outer periphery of the individual panel. The individual panels, which are formed as populated or unpopulated circuit boards or as individual circuits and have been combined to form a complete panel, are provided with metal connections before being separated from the complete panel. The circuit boards or individual circuits in this case often consist of a number of layers of a circuit-board base material, predominantly a plastic or a fiber-reinforced plastic, which are provided with printed, generally metallic, circuits. These circuits may also be arranged three-dimensionally and not only extend over a surface area but also be layered within the circuit-board base material. A number of different or else identical circuit boards or individual circuits are combined to form a complete panel during production, in order to make the production process more efficient. The individual panels, which are respectively independent of one another, are then preferably cut out by means of a laser, the laser removing the circuit-board base material around the contour of the individual panel. This provides a smooth, splinter-free edge at the periphery of the individual panel. In order to prevent the respective individual panel from falling out from the complete panel when the laser has been taken once around the contour, the metal connections are provided. The metal connections hold the individual panels on the complete panel until they are pressed out or otherwise detached from the complete panel in a controlled manner.

A $CO_2$ laser is preferably used for the removal of the circuit-board base material. As stated above, the laser removes the circuit-board base material but does not sever the metal connections. The metal connections may comprise, for exmaple, copper foil. The power for the laser is set to an appropriate level in order to remove the circuit-board base material without severing the metal connections.

The metal connections are preferably attached to the corner region and/or to partial regions of the contour of the respective individual panels, so that the metal connections only provide a partial connection of the individual panels to the complete panel and the separation of the individual panels from the complete panel can be performed with little expenditure of force.

The circuit-board base material is preferably cut out, cutting out with a laser beam having proven to be particularly suitable. Even very small circuit boards with a peripheral contour can be produced in this way without any reworking of the contour having to be performed after the separation of the individual panels from the complete panel. In principle, other separating methods are also possible and envisaged for removing the circuit-board base material.

Copper connections, in particular copper pads, are applied in particular as metal connections. This has the advantage that no special method techniques have to be used, since copper is already used for the circuits on the circuit boards. However, other metal connections are also possible in principle, if so required.

A development of the invention provides that the metal connections are arranged only on one surface of the complete panel or between two layers of material of the circuit-board base material, the arrangement on only one of the surfaces of the complete panel having the advantage that the complete edge region can be cut out splinter-free and to the exact contour at one setting and in one operation.

Before the separation of the individual panel and after the removal of the circuit-board base material, a processing of the individual panel may be performed, for example population with components, known as SMDs (Surface Mounted Devices). Population with components may also be performed before the removal of the circuit-board base material.

A complete circuit board panel having a multiplicity of individual panels of populated or unpopulated circuit boards or individual circuits provides that the individual panels or at least one metal connection are fastened to the circuit-board base material. These metal connections may be formed as metal foil, in particular as copper foil, in order to make easy separation of the individual panels from the complete panel possible by detachment without any tools when the circuit-board base material has been removed the contour of the respective individual panel.

The metal connections may be arranged such that only parts of the contour of the individual panel are overlapped, the overlapping advantageously being present at the corner regions, at which there is generally a lower circuit and component density.

If the metal connection is arranged on a surface of the circuit-board base material, the individual panel can be easily pressed out around the contour of the individual panel after the removal of the circuit-board base material, since the overlapping region of the metal connection or the metal foil that protrudes into the individual panel can be easily detached from the surface of the circuit-board base material. If all of the metal connections are arranged on one and the same side of the complete circuit board panel, the individual panels can be separated from one another to form the respective individual panels very quickly by one and the same relative movement of the complete circuit board panel. The metal connection may be formed as a separate component without being in electrical contact with a circuit, so that there is no impairment of the circuit board circuit or the individual circuit from a functional viewpoint if a deformation of the metal connection occurs during the pressing out. There is therefore no mechanical influencing of the individual panels, or only to an extremely small extent, so that mechanical damage to the individual panels is unlikely.

BRIEF DESCRIPTION OF THE DRAWINGS

An exemplary embodiment of the invention is explained in more detail below on the basis of the accompanying figures, in which.

DETAILED DESCRIPTION

Figure 1:
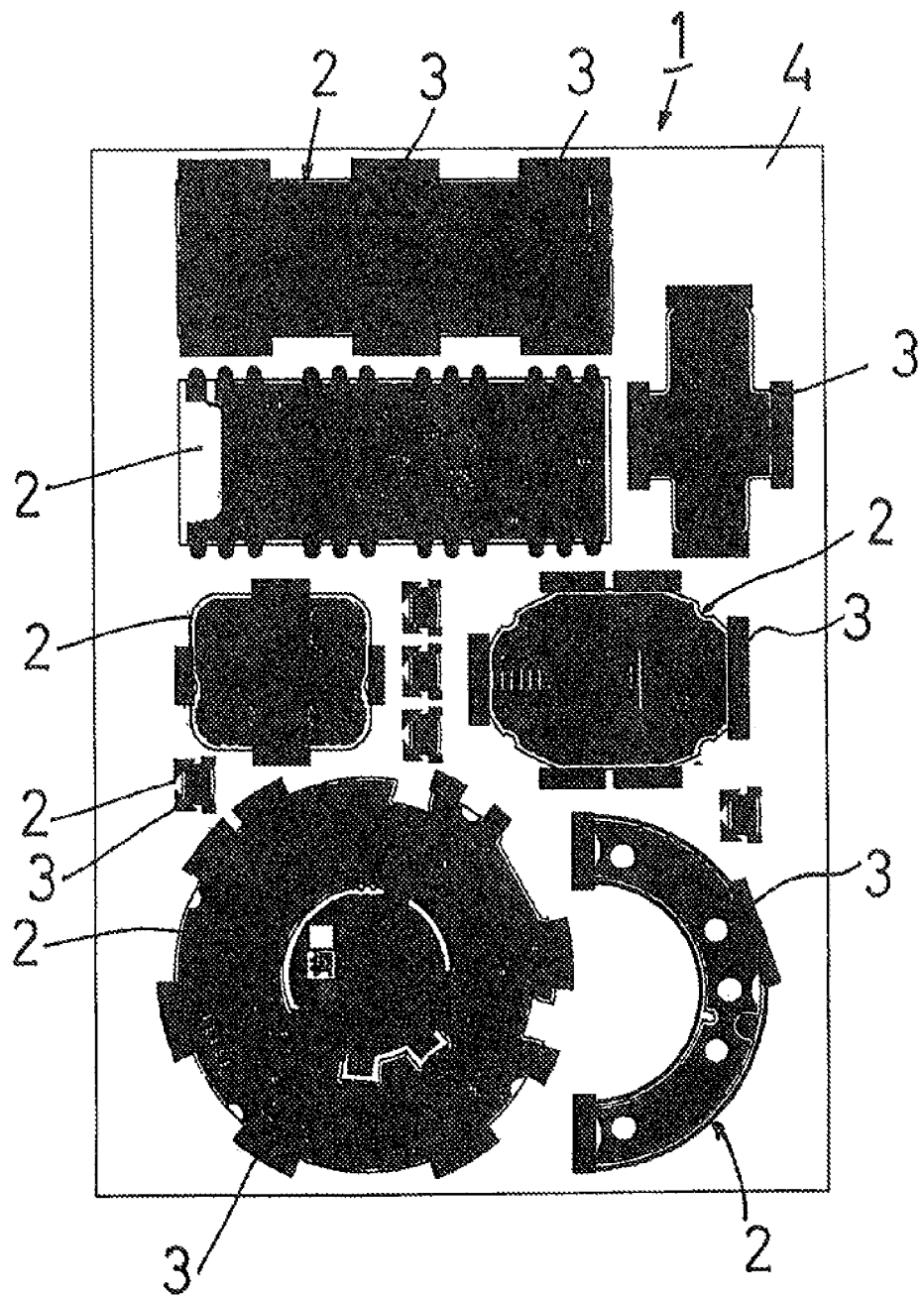
FIG. 1 shows a plan view of a complete circuit board panel with individual panels.

In FIG. 1, a complete panel 1 with a number of individual panels 2 arranged therein is shown in a plan view. The individual panels 2 are formed as populated or unpopulated circuit boards or as individual circuits and are produced by the usual production processes. The multilayered structure is explained later. A view from below is shown, the respective individual panels 2 being formed separately from one another, so that the respective circuit boards or individual circuits can be separated individually.

The complete panel 1 has a circuit-board base material 4, from and on which the individual circuit boards or individual circuits are constructed. Within and above the circuit-board base material 4, electrical circuits are incorporated or arranged, which will be explained later. Applied on the surface of the complete panel 1 are metal connections 3, which take the form of pieces of metal foil. These metal connections 3 are for the most part located outside the contour of the respective individual panel 2 and protrude into the contour of the respective individual panel 2. There they are connected to part of the surface of one side of the individual panel 2, so that, when the individual panels are separated from the circuit-board base material 4, they are fixed to the complete panel 1 by the metal connections 3. In FIG. 1, various configurations of individual panels 2 are shown; apart from round, semicircular and polygonal individual panels 2, star-shaped or oval individual panels 2 are provided in the form of circuit boards or the like. The arrangement of the metal connections 3 is chosen here such that electrical contact with an electrical switching element or circuit does not necessarily take place on the respective circuit boards 2 or individual circuits 2. SMDs may be arranged on the individual panel 2; the arrangement of SMDs or other electrical components may however also only take place after the separation of the individual panels 2 from the complete panel 1.

Figure 2:
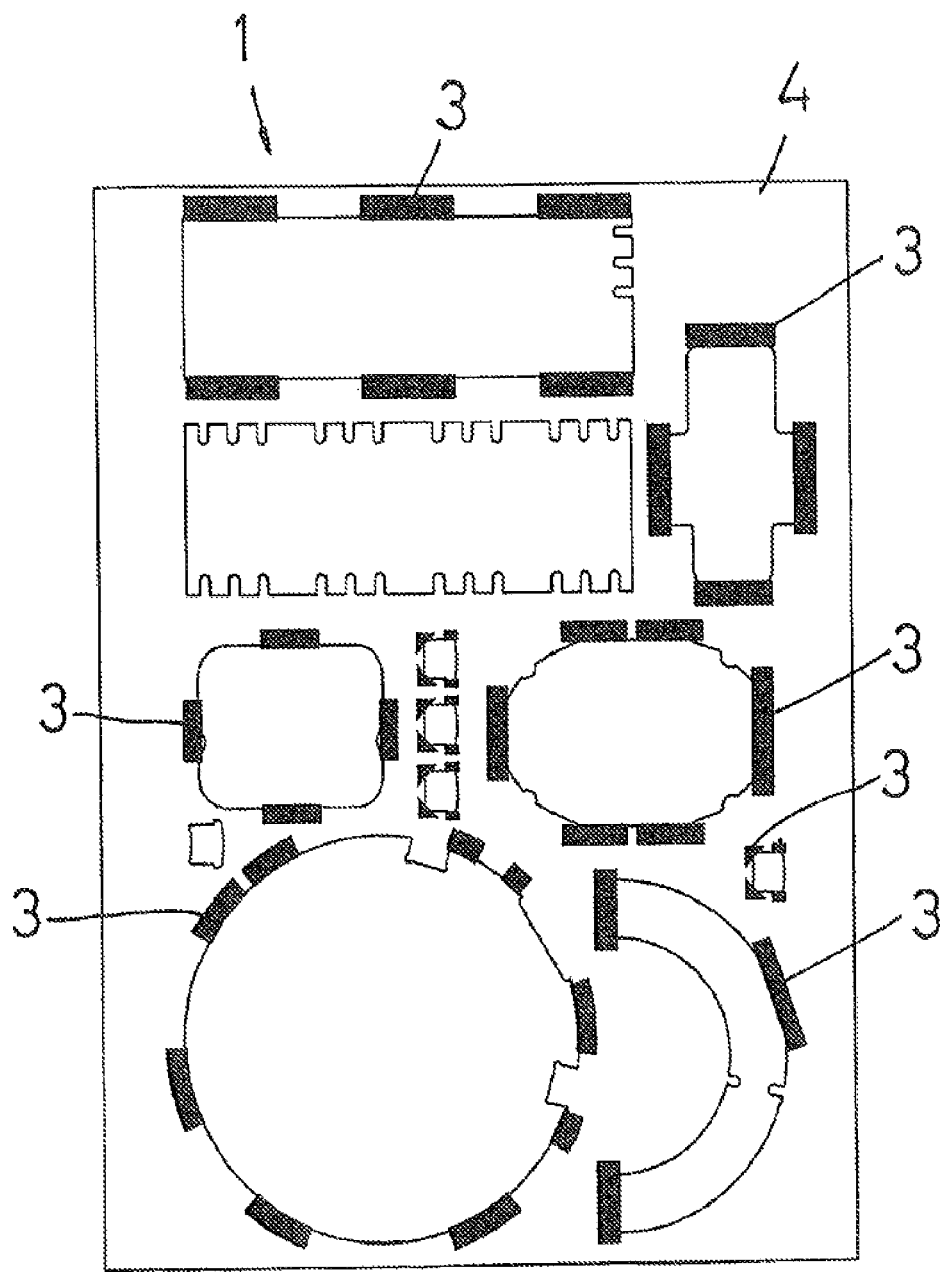
FIG. 2 shows a plan view of a complete circuit board panel after the removal of the individual panels.

In FIG. 2, the complete panel 4 after the separation of the individual panels 2 is shown. The contours of the individual panels can be seen, and so too the metal connections 3, which protrude a little into the contour of the individual panels. It can be seen that the metal connections 3 are arranged only partially around the periphery of the individual panels, and only slightly cover the individual panels, in order to make easy pressing out or removal of the individual panels possible. In the case of some contours, the metal connections are not shown.

Figure 3:
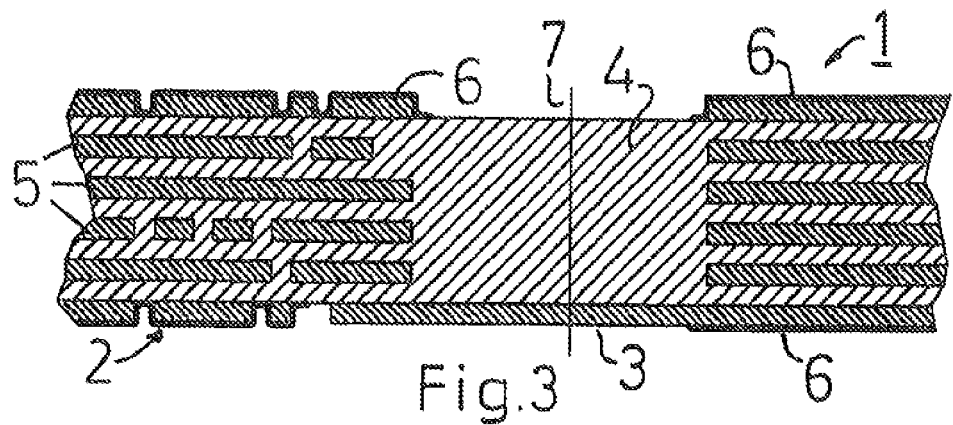
FIGS. 3 to 5 show a schematic representation of the separation of an individual panel.

In FIG. 3, a sectional representation through part of a complete panel 1 is shown. Within the complete panel 1, an individual panel 2 with integrated electrical circuits 5 of copper is shown. The individual circuits are arranged in the electrically non-conducting base material 4 and altogether form an electrical circuit board. The individual panel 2 is surrounded completely around its periphery by the circuit-board base material 4 or base material; the contour line or peripheral line is indicated by the reference numeral 7. Electrical circuits are likewise arranged on the upper side and underside of the circuit-board base material 4, and are sealed by a solder resist 6.

Provided on the underside of the complete panel is a metal connection 3, which protrudes beyond the contour line 7 and establishes a mechanical connection between the complete panel 1 and the individual panel 2. The metal connection 3, preferably likewise of a copper material and for example formed as a metal pad, only partially bridges the contour line 7 and does not extend over the entire periphery or over the entire surface of the underside of the individual panel 2.

Figure 4:
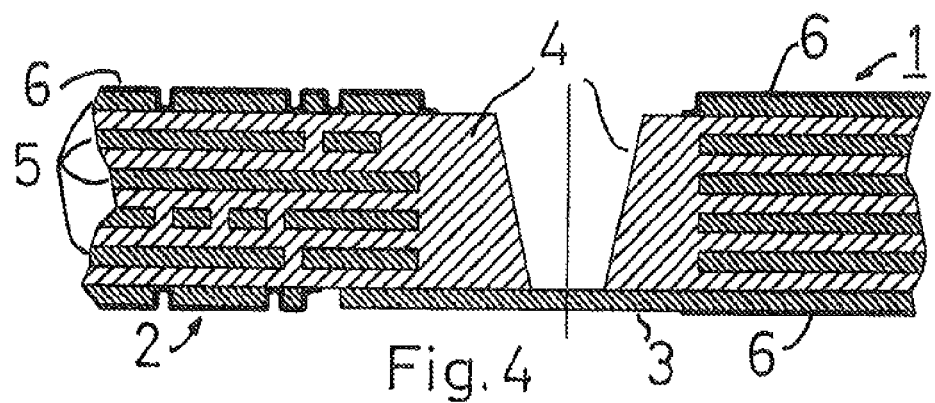

In FIG. 4, the state of the complete panel 1 after the cutting out of the circuit-board base material 4 along the peripheral line 7 is shown. The circuit-board base material 4 is preferably cut out by a laser beam, which is not shown. The laser beam is taken along the contour line 7 around the individual panel 2 and vaporizes the circuit-board base material 4. The laser beam is in this case set such that it completely removes the circuit-board base material 4, but does not destroy the metal connection 3 on the underside. In the state of FIG. 4, the entire circuit-board base material 4 has been removed along the peripheral line 7, so that the individual panels 2 is fixed to the complete panel 1 only by way of the metal connections 3. The solder resist 6 covers the surface both of the individual panel 2 and of the complete panel 1 at the desired locations. The solder resist 6 is usually only applied after the cutting by the laser beam.

Figure 5:
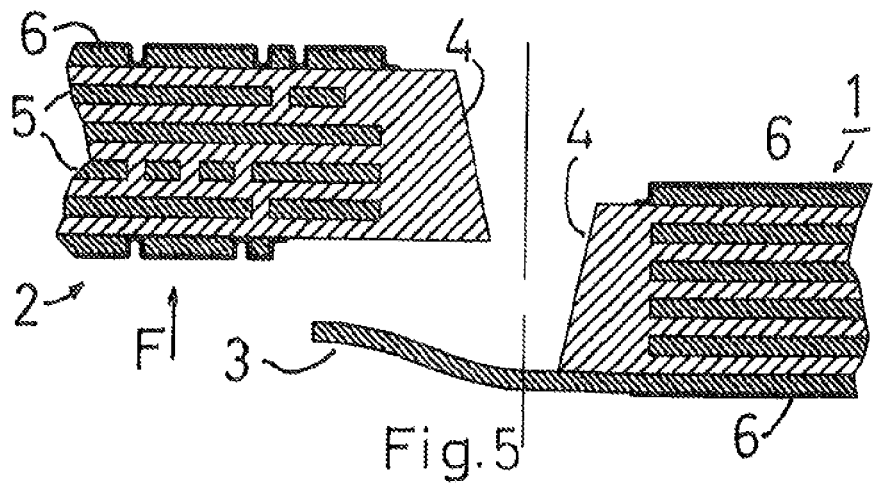

In FIG. 5, the last step of the production process is shown, in which step the individual panel 2 is separated from the complete panel 1 by pressing out of the individual panel 2, which is indicated by the arrow F. Before or after the separation of the individual panel 2 from the complete panel 1, population with electrical or electronic components may take place.

While it was necessary in the past for a circuit board to be laboriously reworked in order to remove remains of the panel connection, it is possible by the method presented and the circuit board panel presented to allow an exact-contour and splinter-free panel connection and production of circuit boards or individual panels 2. Even very small individual panels can be produced with a peripheral contour in such a way that they do not have to be reworked after the separation of the panel. The removal of the base material or circuit-board base material 4 by means of a laser beam prevents mechanical stresses from being introduced into the circuit board or into the individual panel, whereby the production accuracy and the reliability of the individual panels produced in such a way can be increased.

The only partial connection of the individual panels to the complete panel 1 by way of the metal connections 3 makes it possible to handle the complete panel with the individual panels contained therein even after the removal of the circuit-board base material 4, for example to allow further processing steps such as population to be performed. Separation of the individual panels 2 from the complete panel 1 may be performed without a tool on account of the small area of connection.

The low-stress separation of the individual panels 2 from the complete panel 1 allows components to be set very close to the edge of the individual panel 2, so that the area of the individual circuit boards can be optimally utilized.

Arranging the metal connection 3 on the surface of the underside of the circuit boards, for example, has the effect that the contouring of the circuit board is not disturbed. The connection to the complete panel 1 consequently takes place independently of the circuit board design, so that here too there is potential for optimization. The arrangement of the metal connections is advantageously in corner regions or along side edges, but only partially there. The connection of the individual panels by way of copper pads is in this case preferred.

The invention claimed is:

1. A method for producing populated or unpopulated circuit boards or individual circuits as individual panels from a complete panel having a circuit-board base material, the method comprising:
providing the individual panels connected by the circuit-board base material to the complete panel;
fastening the individual panels to the complete panel with metal connections, the metal connections being arranged overlapping only part of a periphery of the individual panels;
removing the circuit-board base material from the complete panel around a periphery of the individual panels with a laser; and
separating the individual panels from the complete panel by pressing out the individual panels away from the metal connections after removing the circuit-board base material.

2. The method as claimed in claim 1, wherein a $CO_2$ laser is used for the removal of the circuit-board base material.

3. The method as claimed in claim 1, wherein the metal connections are attached to at least one of corner regions and partial regions of a periphery of the individual panels.

4. The method as claimed in claim 1, wherein the metal connections are applied as copper connections.

5. The method as claimed in claim 1, wherein the metal connections are arranged on a surface of the complete panel or between two layers of material of the circuit-board base material.

6. The method as claimed in claim 1, wherein before separating the individual panels and after removing the circuit-board base material, the method further comprising processing the individual panel.

7. The method as claimed in claim 4, wherein the copper connections include copper pad.

8. The method as claimed in claim 6, wherein processing includes population with surface mounted devices (SMDs).

9. A method for producing circuit boards, comprising:
providing a complete panel having a circuit-board base material and a plurality of metal connections;
cutting an individual panel from the circuit-board base material of the complete panel with a laser, at one of the plurality of metal connections connecting the individual panel to adjacent circuit-board base material of the complete panel prior to cutting, the metal connections being arranged overlapping only part of a periphery of the individual panel;
separating the individual panel from the complete panel by pressing out the individual panel relative to the adjacent circuit-board base material and disconnecting the individual panel from the at least one of the plurality of metal connections.

10. The method as claimed in claim 9, wherein the laser includes a $CO_2$ laser, and cutting the individual panel includes removing portions of the circuit-board base material.

11. The method as claimed in claim 9, wherein the at least one of the plurality of metal connections is attached to a periphery of the individual panel.

12. The method as claimed in claim 9, wherein the plurality of metal connections are arranged on a surface of the complete panel or between two layers of material of the circuit-board base material.

13. The method as claimed in claim 9, wherein before separating the individual panel and after cutting the individual panel, the method further comprises populating the individual panel with surface mounted devices (SMDs).

* * * * *